(12) United States Patent
Park et al.

(10) Patent No.: US 9,153,626 B2
(45) Date of Patent: Oct. 6, 2015

(54) THIN FILM TRANSISTOR HAVING AT LEAST TWO CARBON NANOTUBE PATTERNS FORMED IN A CHANNEL AND CONNECTED BY AT LEAST ONE FLOATING ELECTRODE AND A DISPLAY DEVICE INCLUDING THE SAME

(71) Applicants: SAMSUNG DISPLAY CO., LTD., Yongin, Gyeonggi-do (KR); SNU R&DB FOUNDATION, Seoul (KR)

(72) Inventors: Sang Ho Park, Suwon-si (KR); Young Ki Shin, Seoul (KR); Yoon Ho Khang, Yongin-si (KR); Joo Hyung Lee, Seoul (KR); Hyung Woo Lee, Anyang-si (KR); Seung Hun Hong, Seoul (KR)

(73) Assignees: SAMSUNG DISPLAY CO., LTD., Yongin, Gyeonggi-Do (KR); SNU R&DB FOUNDATION, Seoul (KR)

( * ) Notice: Subject to any disclaimer, the term of this patent is extended or adjusted under 35 U.S.C. 154(b) by 0 days.

(21) Appl. No.: 14/460,395

(22) Filed: Aug. 15, 2014

(65) Prior Publication Data

US 2014/0353592 A1     Dec. 4, 2014

Related U.S. Application Data

(62) Division of application No. 13/495,045, filed on Jun. 13, 2012, now Pat. No. 8,884,266.

(30) Foreign Application Priority Data

Nov. 16, 2011  (KR) .......................... 10-2011-0119545

(51) Int. Cl.
| | | |
|---|---|---|
| *H01L 29/06* | (2006.01) | |
| *H01L 27/28* | (2006.01) | |
| *H01L 51/00* | (2006.01) | |
| *H01L 51/05* | (2006.01) | |
| *B82Y 10/00* | (2011.01) | |
| *H01L 27/32* | (2006.01) | |

(52) U.S. Cl.
CPC ............... *H01L 27/283* (2013.01); *B82Y 10/00* (2013.01); *H01L 51/0048* (2013.01); *H01L 51/0558* (2013.01); *H01L 27/3274* (2013.01)

(58) Field of Classification Search
CPC ............................ H01L 29/775; H01L 33/04
USPC ........ 257/13, 24, E29.245, E33.005; 438/149
See application file for complete search history.

(56) References Cited

U.S. PATENT DOCUMENTS

| | | | | |
|---|---|---|---|---|
| 6,707,098 | B2* | 3/2004 | Hofmann et al. | 257/324 |
| 7,049,625 | B2* | 5/2006 | Kern et al. | 257/9 |
| 7,262,991 | B2* | 8/2007 | Zhang et al. | 365/185.01 |
| 7,342,277 | B2* | 3/2008 | Radosavljevic et al. | 257/314 |
| 7,382,017 | B2* | 6/2008 | Duan et al. | 257/321 |
| 7,482,652 | B1* | 1/2009 | Yang | 257/314 |

(Continued)

*Primary Examiner* — Caleb Henry
(74) *Attorney, Agent, or Firm* — F. Chau & Associates, LLC

(57) ABSTRACT

A thin film transistor includes a gate electrode configured to receive a control voltage, a source electrode insulated from the gate electrode, and configured to receive an input voltage, a drain electrode insulated from the gate electrode, and configured to receive an output voltage, at least two carbon nanotube patterns formed in a channel region between the source electrode and the drain electrode, wherein the carbon nanotube patterns are separated from each other, and at least one floating electrode connecting the two carbon nanotube patterns to each other.

6 Claims, 10 Drawing Sheets

(56) References Cited

U.S. PATENT DOCUMENTS

| | | | |
|---|---|---|---|
| 7,504,280 B2* | 3/2009 | Khang et al. | 438/99 |
| 7,564,085 B2* | 7/2009 | Jang et al. | 257/296 |
| 7,608,883 B2* | 10/2009 | Radosavljevic et al. | 257/315 |
| 7,629,639 B2* | 12/2009 | Zhang et al. | 257/317 |
| 7,639,524 B2* | 12/2009 | Kang et al. | 365/151 |
| 7,692,223 B2* | 4/2010 | Isobe et al. | 257/288 |
| 7,829,927 B2* | 11/2010 | Bidan et al. | 257/298 |
| 7,847,325 B2* | 12/2010 | Poeppel et al. | 257/288 |
| 7,851,294 B1* | 12/2010 | Basco et al. | 438/211 |
| 7,911,831 B2* | 3/2011 | Rueckes et al. | 365/164 |
| 8,063,430 B2* | 11/2011 | Hong et al. | 257/315 |
| 8,064,253 B2* | 11/2011 | Paul | 365/185.03 |
| 8,395,155 B2* | 3/2013 | Kim et al. | 257/59 |
| 8,546,863 B2* | 10/2013 | Huerta et al. | 257/314 |
| 8,597,997 B2* | 12/2013 | Ivanova-Hristova et al. | 438/257 |
| 2005/0174842 A1* | 8/2005 | Bertin et al. | 365/185.03 |
| 2006/0212976 A1* | 9/2006 | Khang et al. | 977/842 |
| 2006/0220094 A1* | 10/2006 | Lojek | 257/315 |
| 2007/0014151 A1* | 1/2007 | Zhang et al. | 365/185.01 |
| 2007/0064478 A1* | 3/2007 | Zhang et al. | 365/185.01 |
| 2007/0114593 A1* | 5/2007 | Radosavljevic et al. | 257/317 |
| 2008/0011861 A1* | 1/2008 | Ikeda et al. | 235/492 |
| 2008/0042128 A1* | 2/2008 | Furukawa et al. | 257/40 |
| 2008/0084742 A1* | 4/2008 | Kozakai et al. | 365/185.05 |
| 2008/0121996 A1* | 5/2008 | Park et al. | 257/365 |
| 2008/0144365 A1* | 6/2008 | Yamaoka et al. | 365/181 |
| 2008/0203454 A1* | 8/2008 | Asami | 257/298 |
| 2009/0101962 A1* | 4/2009 | Hong et al. | 257/322 |
| 2009/0161438 A1* | 6/2009 | Sandhu et al. | 365/185.18 |
| 2009/0173935 A1* | 7/2009 | Cho et al. | 257/24 |
| 2009/0296481 A1* | 12/2009 | Bertin et al. | 365/185.18 |
| 2010/0187524 A1* | 7/2010 | Isobe et al. | 257/43 |
| 2010/0276667 A1* | 11/2010 | Kim et al. | 257/24 |
| 2011/0079770 A1* | 4/2011 | Cho et al. | 257/24 |
| 2011/0180803 A1* | 7/2011 | Kim et al. | 257/60 |
| 2011/0272752 A1* | 11/2011 | Asami | 257/298 |
| 2012/0280208 A1* | 11/2012 | Jain | 257/20 |
| 2013/0056835 A1* | 3/2013 | Tessler et al. | 257/402 |

* cited by examiner

THIN FILM TRANSISTOR HAVING AT LEAST TWO CARBON NANOTUBE PATTERNS FORMED IN A CHANNEL AND CONNECTED BY AT LEAST ONE FLOATING ELECTRODE AND A DISPLAY DEVICE INCLUDING THE SAME

CROSS-REFERENCE TO RELATED APPLICATIONS

This application is a Divisional of U.S. application Ser. No. 13/495,045 filed on Jun. 13, 2012 which claims priority under 35 U.S.C. §119 to Korean Patent Application No. 10-2011-0119545 filed in the Korean Intellectual Property Office on Nov. 16, 2011, the disclosures of which are incorporated by reference herein in their entireties.

BACKGROUND

1. Technical Field

The present invention relates to a thin film transistor and a display device including the same, and more particularly, to a thin film transistor using a carbon nanotube as a channel and a display device including the same.

2. Discussion of the Related Art

Since the discovery of a carbon nanotube, the carbon nanotube has been researched for use in various fields. Particularly, after a transistor using the carbon nanotube having a semiconductor property was fabricated, additional studies related to its fabrication were performed. Further, as techniques for assembling the carbon nanotube into a desired structure were advanced, carbon nanotube transistors having various structures were developed. Since the carbon nanotube transistors may have very small sizes and be formed in a flexible substrate, new application possibilities have arisen. Further, by purifying only a carbon nanotube having a semiconductor property, a purified carbon nanotube with an improved semiconductor property has been developed, thereby opening the door to more applications.

However, conventional carbon nanotube transistors may operate normally only at a low drain-source voltage of about several volts. In other words, the conventional carbon nanotube transistors do not operate normally when the drain-source voltage is very large. This is because a Schottky barrier generated between the carbon nanotube and an electrode becomes a lot thinner when an applied voltage is very large and, as a result, a Schottky barrier modulation according to a gate voltage becomes negligibly smaller. Accordingly, when a high drain-source voltage is applied, a voltage ratio between on/off states becomes much smaller than that of when the low drain-source voltage is applied. In other words, the semiconductor property of the carbon nanotube may become weak. Therefore, the conventional carbon nanotube transistors are generally limited to low drain-source voltage applications.

SUMMARY

Exemplary embodiments of the present invention provide a thin film transistor including a carbon nanotube having an on/off characteristic of a transistor even when a high chain-source voltage is applied and a display device including the same.

An exemplary embodiment of the present invention provides a thin film transistor, including: a gate electrode configured to receive a control voltage; a source electrode insulated from the gate electrode, and configured to receive an input voltage; a drain electrode insulated from the gate electrode, and configured to receive an output voltage; at least two carbon nanotube patterns formed in a channel region between the source electrode and the drain electrode, wherein the carbon nanotube patterns are separated from each other; and at least one floating electrode connecting the carbon nanotube patterns to each other.

The total number of floating electrodes may be one less than the total number of carbon nanotube patterns.

When the thin film transistor is in a turn-on state, the voltage input to the source electrode may be transferred to the drain electrode through the carbon nanotube patterns and the floating electrode.

Each of the carbon nanotube patterns may include a hydrophilic pattern and a carbon nanotube formed thereon.

The hydrophilic patterns of the carbon nanotube patterns may be separated from each other.

The thin film transistor may further include hydrophobic patterns formed on the same layer as the hydrophilic patterns, except where the hydrophilic patterns are formed.

The thin film transistor may further include a gate insulating layer insulating the gate electrode from the source electrode and the drain electrode.

The gate insulating layer may be formed on the gate electrode, the carbon nanotube patterns may be formed on the gate insulating layer, and the source electrode, the floating electrode, and the drain electrode may be formed on the carbon nanotube patterns.

The source electrode, the floating electrode, and the drain electrode may be formed on the carbon nanotube patterns, the gate insulating layer may be formed on the source electrode, the floating electrode, and the drain electrode, and the gate electrode may be formed on the gate insulating layer.

The carbon nanotube patterns may be formed on the source electrode, the floating electrode, and the drain electrode, the gate insulating layer may be formed on the carbon nanotube patterns, and the gate electrode may be formed on the gate insulating layer.

An exemplary embodiment of the present invention provides a display device, including: a plurality of pixels, wherein a first pixel includes a switching element and a pixel electrode connected thereto; a gate driver configured to apply a gate voltage to the first pixel; a data driver configured to apply a data voltage to the first pixel; and a signal controller configured to control the gate driver and the data driver, wherein the switching element is a thin film transistor and the thin film transistor includes: a gate electrode configured to receive the gate voltage; a source electrode insulated from the gate electrode, and configured to receive the data voltage; a drain electrode insulated from the gate electrode and configured to output the data voltage to the pixel electrode; at least two carbon nanotube patterns formed in a channel region between the source electrode and the drain electrode, wherein the carbon nanotube patterns are separated from each other; and at least one floating electrode connecting the carbon nanotube patterns to each other.

The total number of floating electrodes may be one less than the total number of carbon nanotube patterns.

When the thin film transistor is in a turn-on state, the data voltage received by the source electrode may be transferred to the drain electrode through the carbon nanotube patterns and the floating electrode.

The carbon nanotube patterns may each include a hydrophilic pattern and a carbon nanotube formed thereon.

The hydrophilic patterns may be separated from each other.

The display device may further include hydrophobic patterns formed on the same layer as the hydrophilic patterns, except where the hydrophilic patterns are formed.

The display device may further include a gate insulating layer insulating the gate electrode from the source electrode and the drain electrode.

The gate insulating layer may be formed on the gate electrode, the carbon nanotube patterns may be formed on the gate insulating layer, and the source electrode, the floating electrode, and the drain electrode may be formed on the carbon nanotube patterns.

The source electrode, the floating electrode, and the drain electrode may be formed on the carbon nanotube patterns, the gate insulating layer may be formed on the source electrode, the floating electrode, and the drain electrode, and the gate electrode may be formed on the gate insulating layer.

The carbon nanotube patterns may be formed on the source electrode, the floating electrode, and the drain electrode, the gate insulating layer may be formed on the carbon nanotube patterns, and the gate electrode may be formed on the gate insulating layer.

An exemplary embodiment of the present invention provides a switching device, including: a source electrode; a drain electrode; a floating electrode disposed between the source electrode and the drain electrode; a first carbon nanotube disposed between the source electrode and the floating electrode; and a second carbon nanotube disposed between the drain electrode and the floating electrode.

A voltage input to the source electrode may be provided to the drain electrode via the floating electrode and first and second carbon nanotubes.

DETAILED DESCRIPTION OF THE EMBODIMENTS

Figure 1:
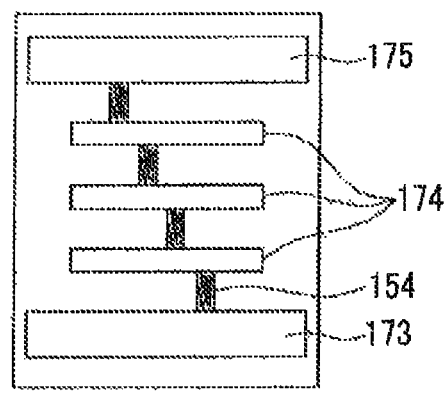
FIG. 1 is a layout view of a thin film transistor according to an exemplary embodiment of the present invention.

Exemplary embodiments of the present invention will be described more fully hereinafter with reference to the accompanying drawings. However, the present invention may be embodied in various different ways and should not be construed as limited to the embodiments disclosed herein.

In the drawings, the thickness of layers, films, panels, regions, etc., may be exaggerated for clarity. Like reference numerals may designate like elements throughout the specification and drawings. It will be understood that when an element such as a layer, film, region, or substrate is referred to as being "on" another element, it can be directly on the other element or intervening elements may also be present.

Hereinafter, a thin film transistor according to an exemplary embodiment of the present invention will be described in detail with reference to FIG. 1.

FIG. 1 is a layout view of a thin film transistor according to an exemplary embodiment of the present invention.

Figure 4:
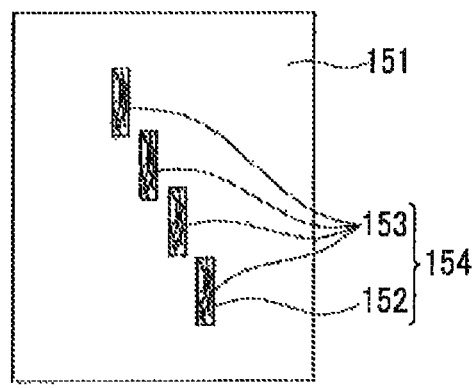
Figure 5:
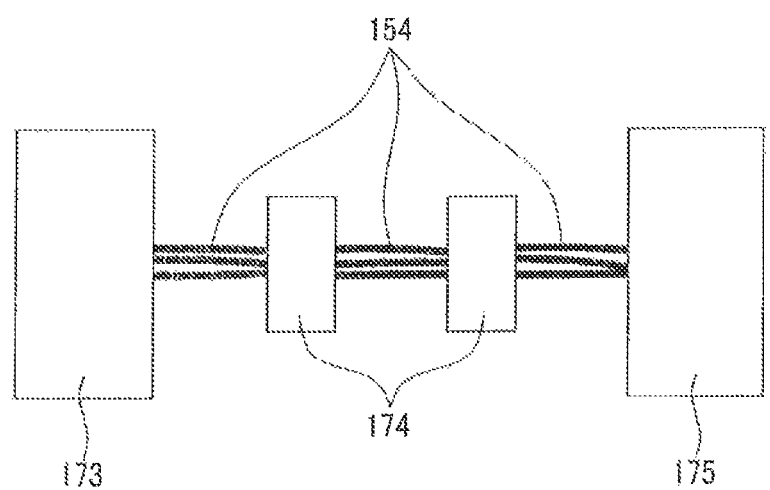
FIG. 5 is a layout view of a thin film transistor according to an exemplary embodiment of the present invention.
Figure 10:
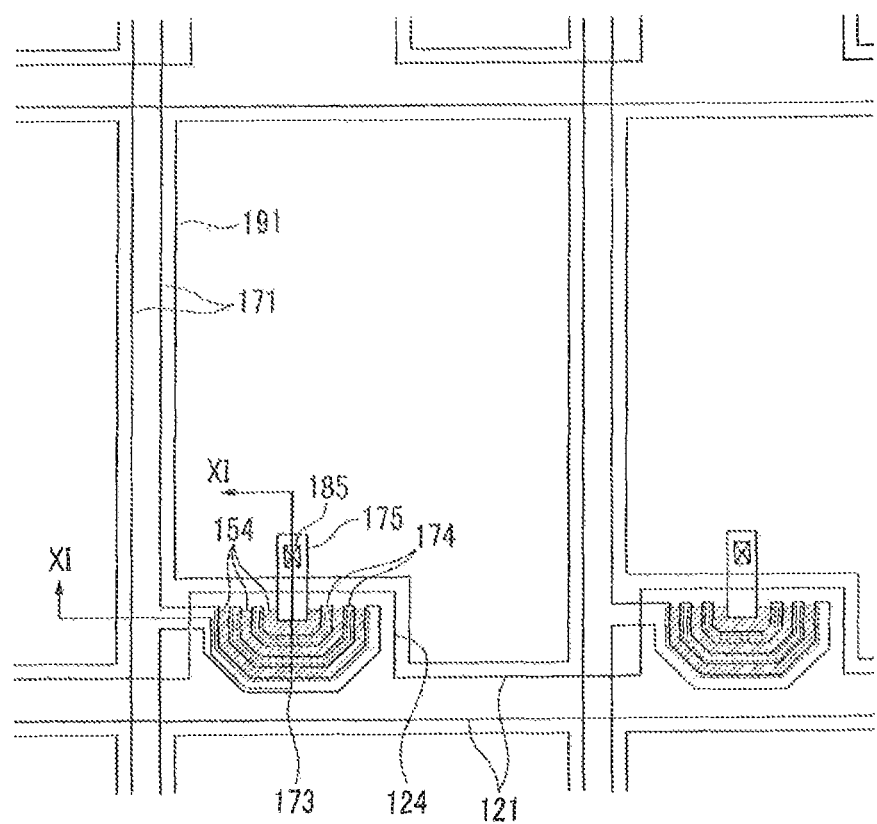
FIG. 10 is a layout view showing a part of a thin film transistor array panel of a display device according to an exemplary embodiment of the present invention.

Referring to FIG. 1, a thin film transistor according to the exemplary embodiment of the present invention includes carbon nanotube patterns 154 formed in a channel region between a source electrode and a drain electrode, wherein at least two of the carbon nanotube patterns 154 are separated from each other. In the exemplary embodiment of the present invention shown in FIG. 1, the thin film transistor includes four carbon nanotube patterns 154 separated from each other. As shown in FIG. 4, each carbon nanotube pattern 154 is disposed in a diagonal direction so that the carbon nanotube patterns 154 are separated from each other. However, as shown in FIGS. 5 and 10, the carbon nanotube patterns 154 which are separated from each other may be variously configured.

The carbon nanotube patterns 154 separated from each other are electrically connected with each other by a floating electrode 174. In other words, the thin film transistor according to the exemplary embodiment of the present invention includes at least one floating electrode 174 for connecting the separated carbon nanotube patterns 154. In the exemplary embodiment of the present invention shown in FIG. 1, three floating electrodes 174 are formed.

The total number of floating electrodes 174 may be one less than the total number of carbon nanotube patterns 154. Further, one floating electrode 174 may be formed in each space between adjacent carbon nanotube patterns 154. As a result, when the thin film transistor is in a turn-on state, a voltage inputted to a source electrode 173 is transferred to a drain electrode 175 through the carbon nanotube patterns 154 and the floating electrodes 174.

The source electrode 173 and the drain electrode 175 are respectively formed at the outermost sides of the carbon nanotube patterns 154 and overlap with the carbon nanotube patterns 154. The source electrode 173 transfers a signal which is inputted from the outside to the carbon nanotube patterns 154, the floating electrode 174 transfers the signal to the carbon nanotube patterns 154 separated from each other, and the drain electrode 175 outputs the signal passing through the carbon nanotube patterns 154 to the outside. The floating electrode 174, the source electrode 173, and the drain electrode 175 may be made of the same material.

The thin film transistor of FIG. 1 does not show a gate electrode. However, the gate electrode may be formed below or above the source electrode 173, the drain electrode 175, the floating electrodes 174, and the carbon nanotube patterns 154 to form the thin film transistor. In FIG. 1, the gate electrode is not shown to highlight the portions of the thin film transistor which are distinct from a conventional transistor.

Figure 11:
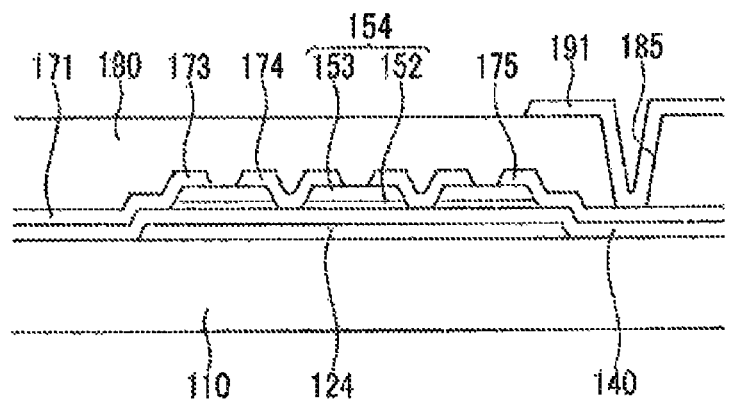
FIG. 11 is a cross-sectional view taken along line XI-XI of FIG. 10.
Figure 12:
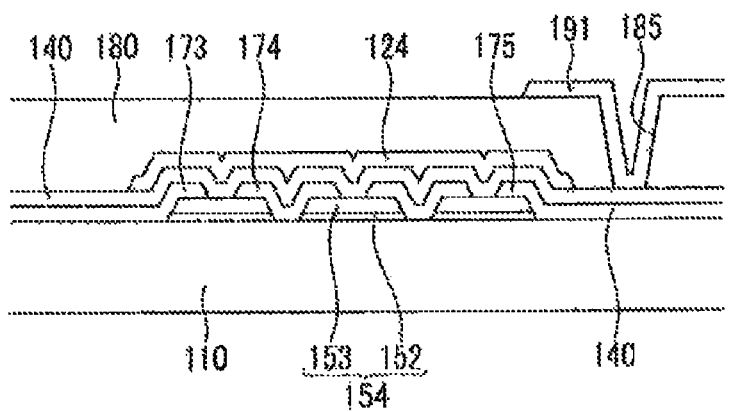
FIGS. 12 and 13 are cross-sectional views of exemplary embodiments of the present invention corresponding to the cross-sectional view shown in FIG. 11.
Figure 13:
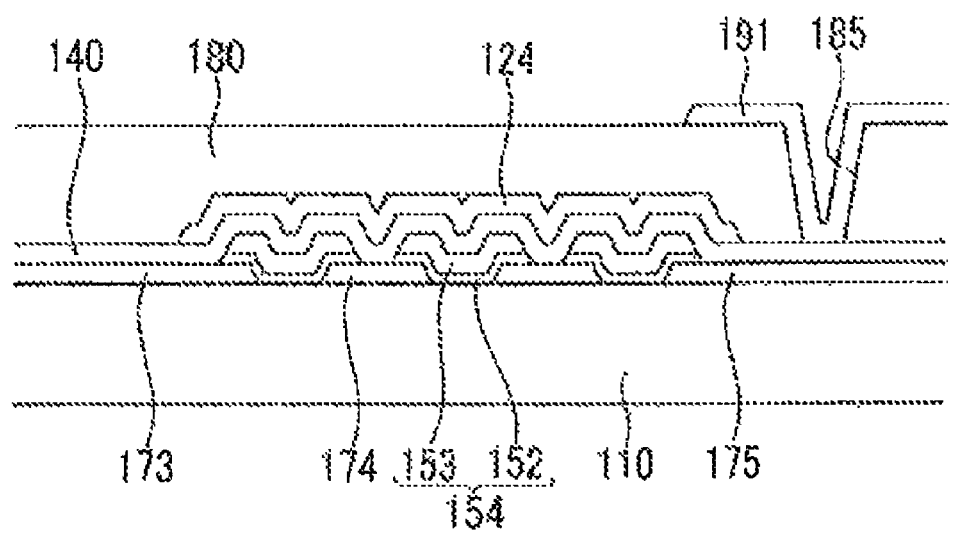

A gate insulating layer may be formed below or above the thin film transistor structure of FIG. 1 and the gate electrode may be formed below or above the thin film transistor structure of FIG. 1. As shown in FIGS. 11 to 13, the gate electrode may be formed to overlap with the entire region in which the carbon nanotube patterns 154 are formed.

In the thin film transistor, a control voltage is applied to the gate electrode, an input voltage is applied to the source electrode, and an output voltage is applied to the drain electrode.

Hereinafter, a method of manufacturing the carbon nanotube patterns 154 according to an exemplary embodiment of the present invention will be described with reference to FIGS. 2 to 4.

Figure 2:
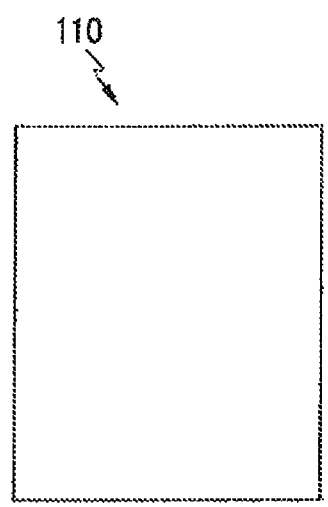
FIGS. 2 to 4 are diagrams illustrating a method of manufacturing carbon nanotube patterns of FIG. 1, according to an exemplary embodiment of the present invention.
Figure 3:
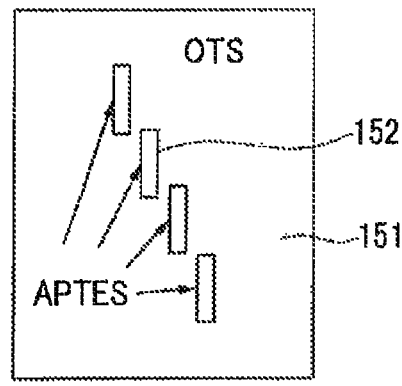

FIGS. 2 to 4 are diagrams illustrating the method of manufacturing the carbon nanotube patterns 154 of FIG. 1 according to an exemplary embodiment of the present invention.

First, as shown in FIG. 2, a substrate 110 to form the carbon nanotube patterns 154 is prepared. Patterns are formed on the substrate 110 before forming the carbon nanotube patterns 154. In other words, when the gate electrode and the gate insulating layer are formed below the carbon nanotube patterns 154, the gate electrode is first formed on the substrate 110 of FIG. 2 and the gate insulating layer covering the gate electrode may be formed thereon.

As shown in FIG. 3, hydrophilic patterns 152 and hydrophobic patterns 151 are formed on the substrate 110 having the patterns already formed thereon. The hydrophilic patterns 152 are formed to correspond to a position where the carbon nanotube patterns 154 are to be formed and the hydrophobic patterns 151 are formed in other regions. To form the hydrophobic and hydrophilic patterns 151 and 152, processes may be performed in various orders, but the formation of the patterns will be described based on an exemplary embodiment of the present invention as follows. First, photoresist patterns are formed so that a photoresist covers a region to form the hydrophilic patterns 152. Next, the hydrophobic patterns 151 are made of a hydrophobic material. Various materials may be used as the hydrophobic material, but in an exemplary embodiment of the present invention, octadecyltrichlorosilane (OTS) is used as the hydrophobic material. Next, after removing the photoresist, the hydrophilic patterns 152 may be formed in the photoresist removed regions. Next, the hydrophilic patterns 152 are made of a hydrophilic material. Various materials may be used as the hydrophilic material, but in an exemplary embodiment of the present invention, aminopropyltriethoxysilane (APTES) is used as the hydrophilic material.

As a result the hydrophobic patterns 151 are formed on the same layer as the hydrophilic patterns 152, except where the hydrophilic patterns 152 are formed.

According to an exemplary embodiment of the present invention, the above process of forming the hydrophobic patterns 151 may be not performed and the hydrophobic patterns 151 may be formed by a method of spraying the hydrophobic material on the entire substrate 110 after forming the hydrophilic patterns 152. In this case, since the hydrophilic material and hydrophobic material do not couple with each other the patterns of FIG. 3 may be formed as shown.

Thereafter, a carbon nanotube is sprayed on the entire substrate 110. Since the carbon nanotube has a hydrophilic characteristic, although the carbon nanotube is sprayed on the entire substrate 110, the carbon nanotube is attached only to the hydrophilic patterns 152 and not to the rest of the regions (e.g., the hydrophobic patterns 151). As described above, since the carbon nanotube does not adhere to the hydrophobic patterns 151, the non-adhered carbon nanotube is removed after being sprayed, such that the carbon nanotube patterns 154 shown in FIG. 4 are formed.

Thereafter, the floating electrode 174, the source electrode 173, and the drain electrode 175 may be formed and made of metal having conductivity. The floating electrode 174 the source electrode 173, and the drain electrode 175 may be made of various metals, and in an exemplary embodiment of the present invention, the floating electrode 174, the source electrode 173, and the drain electrode 175 may be made of palladium (Pd) or gold (Au) and formed with a dual layer of palladium (Pd) and gold (Au). According to an exemplary embodiment of the present invention, the floating electrode 174, the source electrode 173, and the drain electrode 175 may be formed below the carbon nanotube patterns 154, as shown in FIG. 13, and in this case, the floating electrode 174, the source electrode 173, and the drain electrode 175 are already formed in method step of FIG. 2.

Referring to FIG. 3, according to an exemplary embodiment of the present invention, the hydrophobic patterns 151 may be omitted because the carbon nanotube patterns 154 can be formed only by the formation of the hydrophilic patterns 152. Accordingly, the hydrophobic patterns 151, which are the patterns for preventing the carbon nanotube from being attached thereto and further define region separate from the hydrophilic patterns 152, are not necessary.

Hereinafter, a thin film transistor according an exemplary embodiment of the present invention and having different structure from that shown in FIG. 1 will be described.

FIG. 5 is a layout view of a thin film transistor according to an exemplary embodiment of the present invention.

Referring to FIG. 5, a plurality of carbon nanotube patterns 154 are formed in a straight line unlike the carbon nanotube patterns 154 of FIG. 1. Although not dearly shown in FIG. 5, the carbon nanotube patterns 154 are separated from each other below a floating electrode 174. Further, the carbon nanotube patterns 154, which are formed between a source electrode 173 and an adjacent floating electrode 174, a drain electrode 175 and an adjacent floating electrode 174, or between the floating electrodes 174, are not formed in one line, but formed in three lines. The region between the floating electrodes 174 may hereinafter he referred to as a "small channel region" to distinguish it from the channel region formed between the source electrode 173 and the drain electrode 175. In other words, the carbon nanotube pattern 154 formed in the small channel region does not have to be one linear pattern, but may be a plurality of linear patterns. Further, according to an exemplary embodiment of the present invention shown in FIG. 10, the carbon nanotube pattern 154 may not have the linear pattern.

In the exemplary embodiment of the present invention shown in FIG. 5, two floating electrodes 174 are formed, but the number of the floating electrodes 174 may be increased or decreased according to an exemplary embodiment of the present invention.

Characteristics of a thin film transistor which has the carbon nanotube patterns 154 separated from each other and connects the carbon nanotube patterns 154 through the floating electrodes 174 as shown in FIGS. 1 and 5, will be described below with reference to FIGS. 6 to 8.

Figure 6:
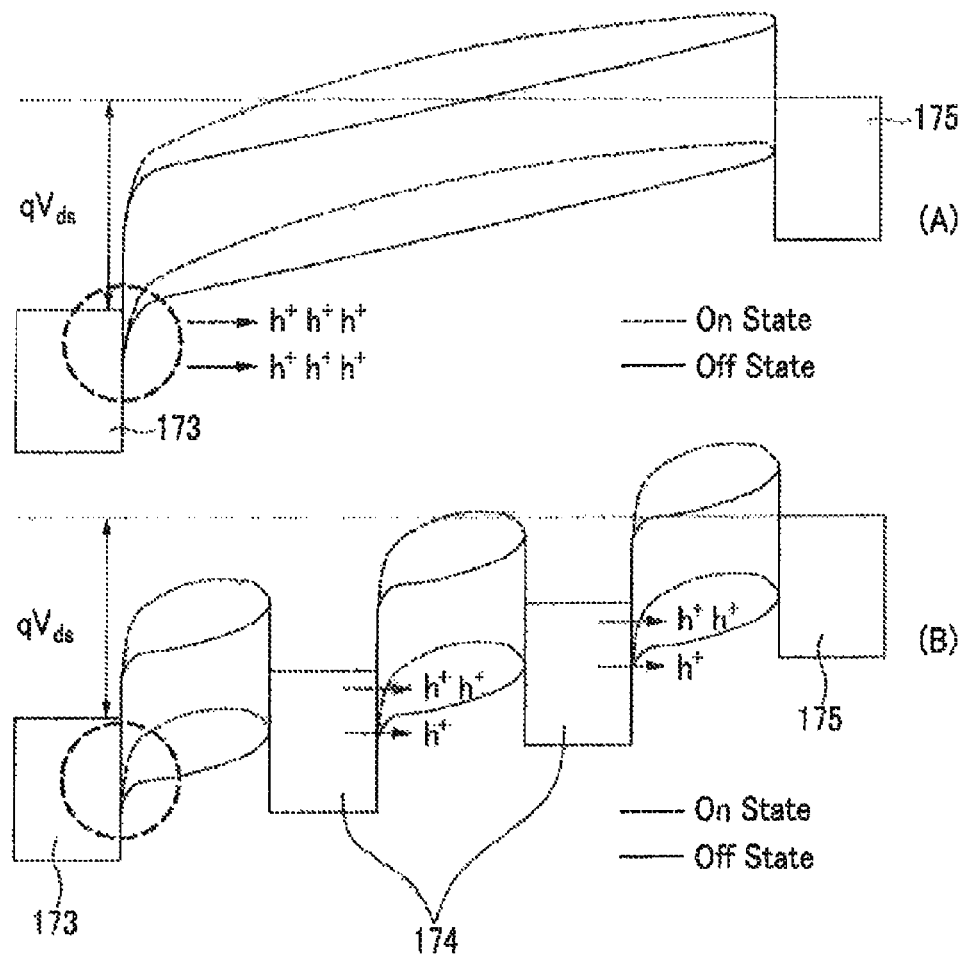
FIGS. 6 to 8 are graphs showing on/off characteristics of a conventional thin film transistor and a thin film transistor according to an exemplary embodiment of the present invention.
Figure 7:
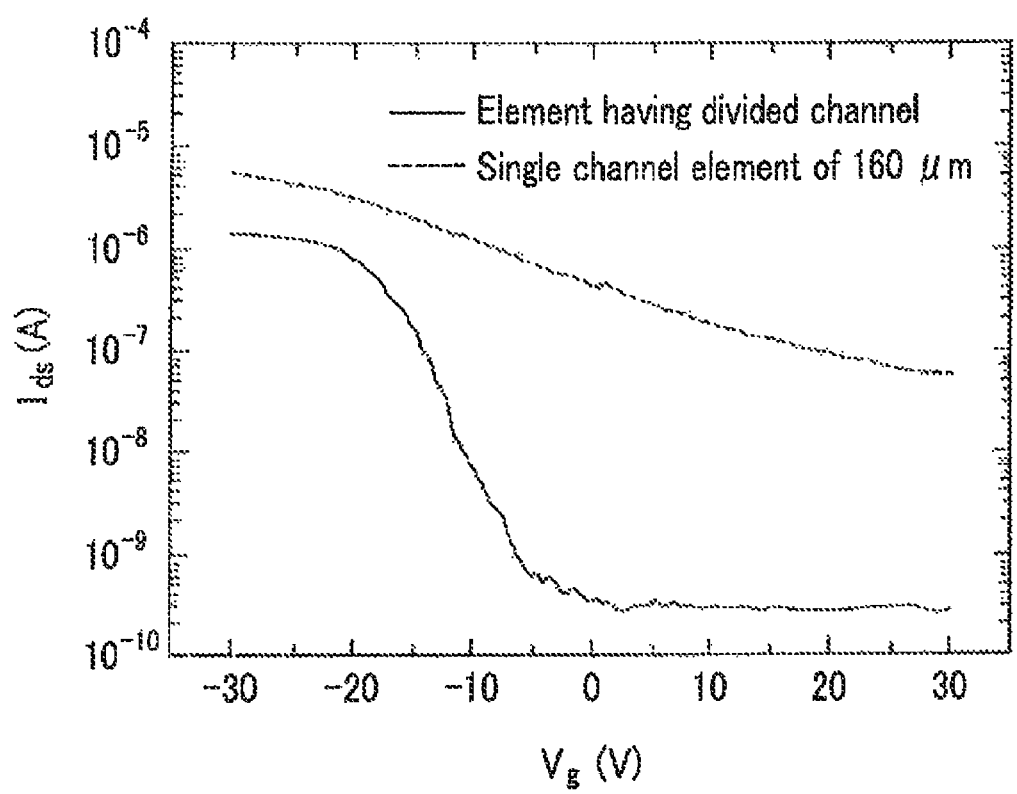
Figure 8:
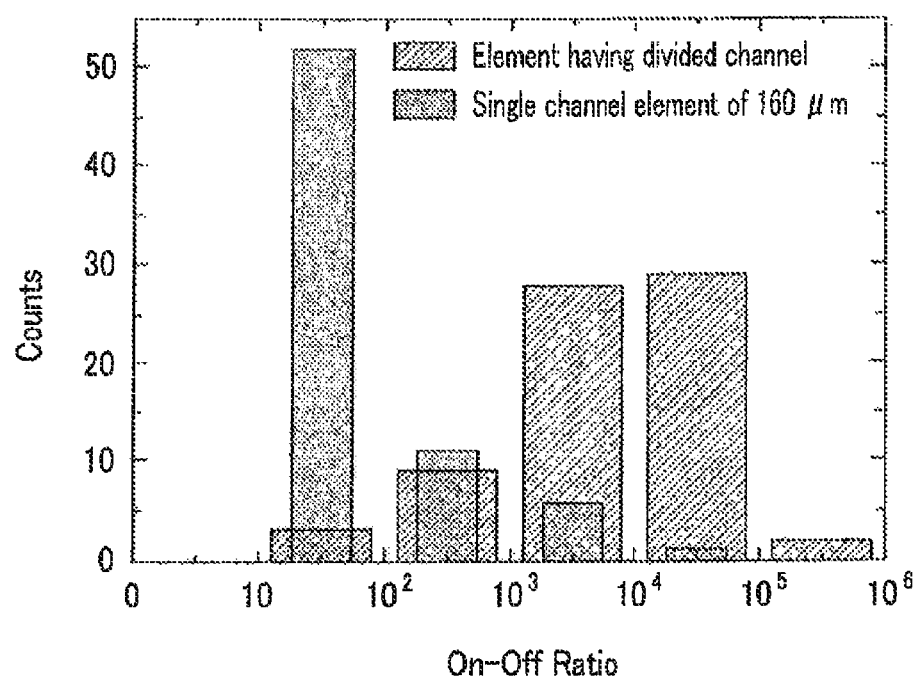

FIGS. 6 to 8 are graphs showing on/off characteristics of a conventional thin film transistor and a thin film transistor according to an exemplary embodiment of the present invention.

FIG. 6 is a graph illustrating a difference in an energy band structure between a conventional thin film transistor and a thin film transistor according to an exemplary embodiment of the present invention.

FIG. 6A shows an energy band of a conventional thin film transistor using a carbon nanotube and FIG. 6B shows an energy band of the thin film transistor of FIG. 5, according to the exemplary embodiment of the present invention.

As shown in FIG. 6A, the energy band of the conventional thin film transistor has one energy band between a source electrode 173 and a drain electrode 175 and, when a voltage between both electrodes is high, a Schottky harrier becomes thin and many holes h+ are transferred to the drain electrode 175 beyond the barrier. In other words, regardless of whether the thin film transistor is in an on state or off state, many holes h+ are transferred to the drain electrode 175. As shown in FIG. 6A, the number of the moving holes h+ is three in each state. Further, since the carbon nanotube has high mobility, resistance is relatively small and, as a result, when a drain-source voltage is large, the characteristic of the semiconductor carbon nanotube is reduced.

However, as shown in FIG. 6B, when the floating electrodes 174 are disposed at the channel of the thin film transistor, although a high voltage is applied between the source electrode 173 and the drain electrode 175, since a plurality of energy bands exist to minimize the deterioration in a Schottky barrier modulation, a case where the holes h+ are transferred to the drain electrode 175 beyond the barrier is distinguished from a case where the holes h+ are not transferred to the drain electrode 175. In other words, in FIG. 6B, a different number of holes h+ are represented to show that the number of holes h+ moving in a small channel region are different from each other in an on state and an off state.

Thus, in an exemplary embodiment of the present invention, when a high voltage is applied to the source electrode 173 which is separated from the drain electrode 175 by a plurality of small channels, the movement of the holes h+ is blocked by the floating electrode 174 to demarcate the on state from the off state. As a result, the thin film transistor according to the exemplary embodiment of the present invention may use the carbon nanotube, but maintains a characteristic of a switching element even when the drain-source voltage is a high voltage of 10V or more. As a result, in a device such as a display device where the drain-source voltage of its switching elements is high, the thin film transistor according to an exemplary embodiment of the present invention may be used as a switching element.

FIGS. 7 and 8 are graphs illustrating a result of examining characteristics of a thin film transistor according to an exemplary embodiment of the present invention after its actual manufacture versus a conventional thin film transistor.

The conventional thin film transistor was formed to have a channel length of 160 μm and no floating electrode and the thin film transistor according to the exemplary embodiment of the present invention was formed by separating a channel like that shown in FIG. 5.

First, FIG. 7 will be described.

FIG. 7 is a graph showing a current between the drain and the source (hereinafter, a drain-source current) according to a gate voltage when a drain source voltage of a high voltage of 30 V is applied.

The conventional thin film transistor is shown as a "single channel element of 160 μm" and the drain-source current thereof is slowly reduced according to gate voltage Vg. The on state and the off state should be distinguished from each other so that the thin film transistor can be used as a switching element, but since the on state and the off state are not distinguishable from each other, as illustrated by the above characteristic, the thin film transistor may not be properly used as a switching element when the drain-source voltage is 30 V.

On the contrary, the thin film transistor according to the exemplary embodiment of the present invention is shown as an "element having divided channel" and the drain-source current thereof is rapidly reduced between −20V to 0V as the gate voltage Vg is changed. Therefore, since the thin film transistor has the on state in the voltage range of −20V or less and has the off state in the voltage range of 0 V or more, although the drain source voltage is 30 V, the thin film transistor may be properly used as a switching element.

In FIG. 8, 70 conventional thin film transistors and 70 thin film transistors according to an exemplary embodiment of the present invention were formed and when the drain-source voltage was 30 V, ratios of the current in the on state and the current in the off state were calculated, respectively. In FIG. 8, a horizontal axis is an on-off ratio of the current in the on state and the current in the off state and a vertical axis is counts (e.g., the number of thin film transistors).

In FIG. 8, the number of conventional thin film transistors having the on-off ratio of 10 or more to 100 or less is above 50 and, as the on-off ratio increases, the number of the conventional thin film transistors decreases. In other words, most of the conventional thin film transistors have several tens times difference between the current in the on state and the current in the off state.

On the contrary, when the on-off ratio is 1,000 or more to 100,000 or less, the thin film transistors according to the exemplary embodiment of the present invention have their most numbers. As a result, in the thin film transistor according to the exemplary embodiment of the present invention, since a difference between the current in the on state and the current in the off state is one thousand or more times, the on state and the off state are easily distinguished from each other, such that the thin film transistor may be used as a switching element.

In FIG. 8, the on-off ratio may be small for a small number of transistors made in accordance with an exemplary embodiment of the preset invention having the divided channel. Accordingly, by forming more of the floating electrodes 174, the on-off ratio may be improved, thereby reducing the number of these defective transistors. Further, by improving the purity of the carbon nanotube to about 99 percent, such defects may be further reduced.

Therefore, referring to FIGS. 6 to 8, in the thin film transistor according to the exemplary embodiment of the present invention, although the carbon nanotubes are used, since the carbon nanotubes are separated from each other and the separated carbon nanotubes are connected to each other through the floating electrodes 174, even though the drain-source voltage is the high voltage of 10V or more, the on state and the off state may be distinguished from each other, such that the thin film transistor may be used as a switching element.

As a result, the thin film transistor according to an exemplary embodiment of the present invention may be used as a switching element even in fields where large drain-source, voltages are employed. These fields are various and encompass display devices, sensor detection, and the like. For example, a relatively high voltage is used by a display device to display white or black.

As described above, the thin film transistor according to the exemplary embodiment of the present invention is efficient in that it may be used in fields in which high drain-source voltages are applied, and because it may also be used in fields where low drain-source voltages are applied. In the low drain-source voltage case, since the Schottky barrier doest not become smaller, both the conventional thin film transistor and the thin film transistor according to an exemplary embodiment of the present invention having the floating electrode 174 may be used.

Hereinafter, an example in which a thin film transistor according to an exemplary embodiment of the present invention is used in a high drain-source voltage application, such as a display device, will be described.

The display device may be of various display device types, such as a liquid crystal display, an organic light emitting device, an electrophoretic display, and the like, and hereinafter, the liquid crystal display will be described as an example.

Figure 9:
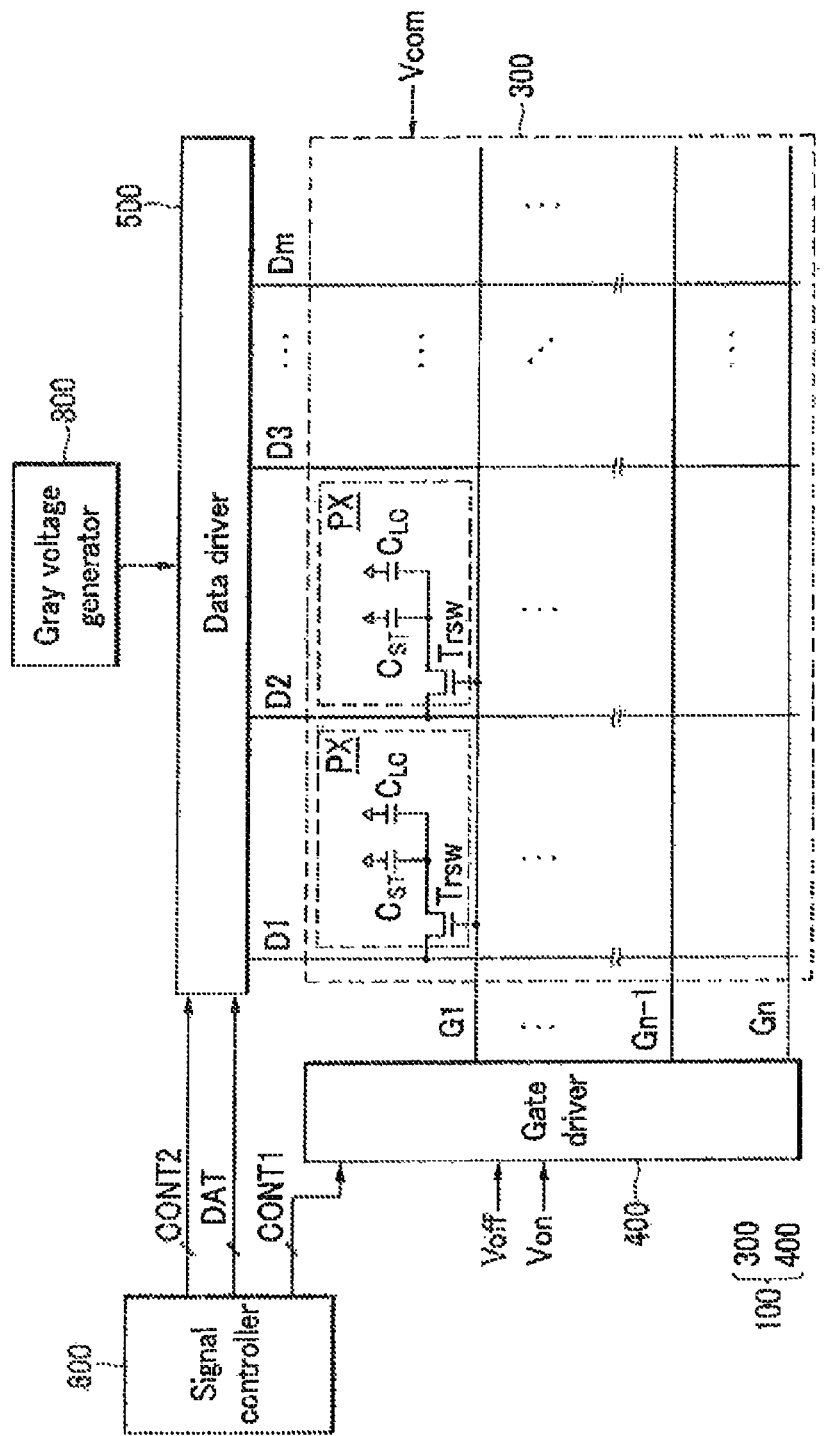
FIG. 9 is a block diagram of a display device according to an exemplary embodiment of the present invention.

FIG. 9 is a block diagram of a display device according to an exemplary embodiment of the present invention.

Referring to FIG. 9, a display panel 100 according to an exemplary embodiment of the present invention includes a display area 300 for displaying an image and a gate driver 400 for applying a gate voltage to a gate line of the display area 300. The gate driver 400 may be integrated with the display panel 100.

A data line of the display area 300 receives a data voltage from a data driver 500 formed on a film such as a flexible printed circuit film (FPC) attached to the display panel 100.

The gate driver 400 and the data driver 500 are controlled by a signal controller 600.

A printed circuit hoard (PCB) is formed at the outside of the FPC to transfer a signal (e.g., CONT1, CONT2, DAT) from the signal controller 600 to the data driver 500 and the gate driver 400.

The display area 300 includes pixels PX arranged in a matrix form and in FIG. 9, a liquid crystal panel is shown as an example. In an organic light emitting device, for example, an organic light emitting panel forms the display area 300 including a thin film transistor and an organic light emitting diode and, in other display device types, a display panel forms the display area 300 including elements such as a thin film transistor and the like.

The display area 300 includes a plurality of gate lines G1-Gn and a plurality of data lines D1-Dm and the plurality of gate lines G1-Gn and the plurality of data lines D1-Dm are insulated from each other and cross each other.

Each pixel PX includes a thin film transistor Trsw, a liquid crystal capacitor Clc, and a storage capacitor Cst. A control terminal of the thin film transistor Trsw is connected to one gate line, an input terminal of the thin film transistor Trsw is connected to one data line, and an output terminal of the thin film transistor Trsw is connected to one terminal of the liquid crystal capacitor Clc and one terminal of the storage capacitor Cst. The other terminal of the liquid crystal capacitor Clc is connected to a common electrode and the other terminal of the storage capacitor Cst receives a storage voltage Vcst applied from the signal controller 600.

Herein, as the thin film transistor Trsw formed in each pixel PX the thin film transistor according to the exemplary embodiments of the present invention shown in FIGS. 1 and 5 may be used. In other words, the channel of the thin film transistor Trsw is formed by using a plurality of carbon nanotube patterns 154 separated from each other, and connected to each other via floating electrodes 174.

Still referring to FIG. 9, the plurality of data lines D1-Dm receive the data voltage from the data driver 500 and the plurality of gate lines G1-Gn receive a gate voltage from the gate driver 400.

The data driver 500 is formed above or below the display panel 100 to be connected with the data lines D1-Dm extending in a vertical direction and selects a corresponding data voltage among gray voltages generated in a gray voltage generator 800 to apply the selected data voltage to the data lines D1-Dm.

The gate driver 400 alternately applies a gate-on voltage Von and a gate-off voltage Voff to the gate lines G1-Gn and the gate-on voltage is sequentially applied to the gate lines G1-Gn.

Hereinafter, the structure of a pixel (e.g., one of the pixels PX in FIG. 9) will be described with reference with FIGS. 10 and 11.

FIG. 10 is a layout view showing part of a thin film transistor array panel of a display device according to an exemplary embodiment of the present invention and FIG. 11 is a cross-sectional view taken along line XI-XI of FIG. 10.

Referring FIGS. 10 and 11, a plurality of gate lines 121 are formed on an insulation substrate 110 made of transparent glass or plastic.

The gate lines 121 transfer a gate signal and extend in a horizontal direction. Each gate line 121 includes a plurality of gate electrodes 124 protruding from the gate line 121.

The gate line 121 may have a tapered side.

A gate insulating layer 140 made of an insulating material such as silicon nitride is formed on the gate line 121.

The separated carbon nanotube patterns 154 each including a carbon nanotube are formed on the gate insulating layer 140. The separated carbon nanotube patterns 154 have a U-letter shape, but may have a linear shape as shown in FIGS. 1 and 5). In the exemplary embodiment of the present invention shown in FIG. 10, three separated carbon nanotube patterns 154 are formed and spaced apart from each other with a constant interval.

Referring to FIG. 11, the carbon nanotube pattern 154 includes a hydrophilic pattern 152 and a carbon nanotube 153 formed thereon. According to an exemplary embodiment of the present invention, the hydrophilic pattern 152 may not he included.

A plurality of data lines 171, a plurality of drain electrodes 175, and a plurality of floating electrodes 174 are formed on the gate insulating layer 140 and the carbon nanotube pattern 154.

The data lines 171 transfer a data signal and extend in a vertical direction to cross the gate lines 121. Each data line 171 includes a plurality of source electrodes 173 extending toward the gate electrodes 124 with a U-letter shape.

The drain electrode 175 is separated from the data line 171 and extends upwards from the center of the U-letter shape of the source electrode 173.

The floating electrode 174 is formed in a U-letter shape between the drain electrode 175 and the source electrode 173 and overlaps with the separated carbon nanotube patterns 154 to electrically connect the carbon nanotube patterns 154 to each other.

Portions of the carbon nanotube patterns 154 overlap with at least one of the source electrode 173, the floating electrode 174, and the drain electrode 175. In other words, in FIG. 10, the outside portion of the largest carbon nanotube pattern 154 overlaps with the source electrode 173 and the inside portion thereof overlaps with the larger floating electrode 174 of two floating electrodes 174. Further, the outside portion of the carbon nanotube pattern 154 formed in the middle overlaps with the larger floating electrode 174 of the two floating electrodes 174 and the inside portion thereof overlaps with the smaller floating electrode 174 of the two floating electrodes 174. Finally, the outside portion of the smallest carbon nanotube pattern 154 overlaps with the smaller floating electrode 174 of the two floating electrodes 174 and the inside portion thereof overlaps with the drain electrode 175.

The data line 171, the drain electrode 175, and the floating electrode 174 may have tapered sides, respectively.

The carbon nanotube patterns 154 are in contact with the source electrode 173, the floating electrode 174, and the drain electrode 175 and the source electrode 173, the floating electrode 174, and the drain electrode 175 may use palladium (Pd), gold (Au), or the like to improve a contact characteristic with the carbon nanotubes 153. According to an exemplary embodiment of the present invention, a separate layer for improving the contact characteristic with the carbon nanotubes 153 may be further included between the carbon nanotube patterns 154 and the source electrode 173, the floating electrode 174, and the drain electrode 175.

One gate electrode 124, one source electrode 173, and one drain electrode 175 form one thin film transistor (TFT) together with the carbon nanotube patterns 154 and the floating electrodes 174. In the exemplary embodiment of the present invention shown in FIG. 10, three carbon nanotube patterns 154 are formed and two floating electrodes 174 are formed.

Further, the gate electrode 124 has a width including all regions where the plurality of carbon nanotube patterns 154 are formed.

In the structure described above, the channel of the thin film transistor is formed in the carbon nanotube patterns 154 and since the thin film transistor has three carbon nanotube patterns 154, the thin film transistor has a plurality of separated channels.

A passivation layer 180 is formed on the data line 171, the source electrode 173, the drain electrode 175, the floating electrode 174, and the exposed carbon nanotube patterns 154. The passivation layer 180 is made of an inorganic insulator such as silicon nitride or silicon oxide, an organic insulator, a low dielectric insulator, or the like.

A contact hole 185 exposing an end of the drain electrode 175 is formed on the passivation layer 180.

A pixel electrode 191 is formed on the passivation layer 180. The pixel electrode 191 is physically and electrically connected to the drain electrode 175 through the contact hole 185 and receives a data voltage from the drain electrode 175. The pixel electrode 191 to which the data voltage is applied generates an electric field together with a common electrode (not shown and formed on an opposite display panel or formed on a thin film transistor array panel) receiving a common voltage (e.g., VcoM in FIG. 9), thereby determining a direction of liquid crystal molecules of a liquid crystal layer (not shown) between the two electrodes. The pixel electrode 191 and the common electrode form a capacitor (hereinafter, referred to as a "liquid crystal capacitor") to maintain the applied voltage even after the thin film transistor is turned off.

The pixel electrode 191 overlaps with a storage electrode line (not shown) to form a storage capacitor and, as a result, a voltage storage capacity of the liquid crystal capacitor may be reinforced.

The pixel electrode 191 may be made of a transparent conductor such as indium tin oxide (ITO) or indium zinc oxide (IZO).

Various modifications may be made to the pixel structure of the liquid crystal display shown in FIGS. 10 and 11. For example, the gate line 121 or the data line 171 may have a curved shape and a domain dividing means (e.g., a protrusion or groove) may be formed in the pixel electrode 191. In addition, one pixel may be divided into two or more subpixels and a switching element may be formed in each subpixel. When a plurality of switching elements are formed in one pixel, each switching element may be a thin film transistor according to an exemplary embodiment of the present invention.

Hereinafter, a structure of a thin film transistor according to exemplary embodiments of the present invention will be described with reference to FIGS. 12 and 13.

FIGS. 12 and 13 are cross-sectional views of exemplary embodiments of the present invention corresponding to the cross-sectional view shown in FIG. 11.

In the exemplary embodiment of the present: invention shown in FIG. 11, the layers of the thin film transistor have an order of (1) the gate electrode 124, (2) the gate insulating layer 140, (3) the carbon nanotube patterns 154, and (4) the source electrode 173, the drain electrode 175, and the floating electrode 174 from the surface of the substrate 110 up.

The layers of the thin film transistor may be arranged in a different order from that shown in FIG. 11.

For example, in FIG. 12, the layers of the thin film transistor have an order of (1) the carbon nanotube patterns 154, (2) the source electrode 173, the drain electrode 175, and the floating electrode 174 (3) the gate insulating layer 140, and (4) the gate electrode 124 from the surface of the substrate 110 up.

In FIG. 13, the layers of the thin film transistor have an order of (1) the source electrode 173, the drain electrode 175, and the floating electrode 174, (2) the carbon nanotube patterns 154, (3) the gate insulating layer 140, and (4) the gate electrode 124 from the surface of the substrate 110 up.

Unlike the structure of FIG. 11, FIGS. 12 and 13 show a structure in which the gate electrode 124 is disposed above the carbon nanotube pattern 154.

As described above, the thin film transistor according to the exemplary embodiments of the present invention described with reference to FIGS. 1, 5, and 10 to 13 has various structures.

However, the thin film transistor may have various other structures, in which two or more separated carbon nanotube patterns are formed and floating electrodes connecting the separated carbon nanotube patterns with each other are formed.

According to the exemplary embodiments of the present invention, since the thin film transistor includes the separated carbon nanotube patterns and the floating electrodes connecting the separated carbon nanotube patterns in the channel, even though the drain-source voltage of the high voltage of 10 V or more is applied, a difference between a characteristic of the on state of the thin film transistor and a characteristic of the off state thereof is determinable, such that the thin film transistor can serve as a switching element. As a result, in applications such as a display device in which a high voltage of 10 V or more is used as the drain-source voltage, the thin film transistor can be used as the switching element.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A thin film transistor, comprising:
    a gate electrode configured to receive a control voltage;
    a source electrode insulated from the gate electrode, and configured to receive an input voltage;
    a drain electrode insulated from the gate electrode, and configured to receive an output voltage;
    at least two carbon nanotube patterns formed in a channel region between the source electrode and the drain electrode, wherein the carbon nanotube patterns are separated from each other;
    at least one floating electrode connecting the carbon nanotube patterns to each other; and
    a gate insulating layer insulating the gate electrode from the source electrode and the drain electrode.

2. The thin film transistor of claim 1, wherein the source electrode, the floating electrode, and the drain electrode are formed on the carbon nanotube patterns, the gate insulating layer is formed on the source electrode, the floating electrode, and the drain electrode, and the gate electrode is formed on the gate insulating layer.

3. The thin film transistor of claim 1, wherein the carbon nanotube patterns are formed on the source electrode, the floating electrode, and the drain electrode, the gate insulating layer is formed on the carbon nanotube patterns, and the gate electrode is formed on the gate insulating layer.

4. A display device, comprising:
a plurality of pixels, wherein a first pixel comprises a switching element and a pixel electrode connected thereto;
a gate driver configured to apply a gate voltage to the first pixel; a data driver configured to apply a data voltage to the first pixel; and
a signal controller configured to control the gate driver and the data driver, wherein the switching element is a thin film transistor and the thin film transistor comprises:
a gate electrode configured to receive the gate voltage;
a source electrode insulated from the gate electrode, and configured to receive the data voltage;
a drain electrode insulated from the gate electrode and configured to output the data voltage to the pixel electrode;
at least two carbon nanotube patterns formed in a channel region between the source electrode and the drain electrode, wherein the carbon nanotube patterns are separated from each other;
at least one floating electrode connecting the carbon nanotube patterns to each other; and
a gate insulating layer insulating the gate electrode from the source electrode and the drain electrode.

5. The display device of claim 4, wherein the source electrode, the floating electrode, and the drain electrode are formed on the carbon nanotube patterns, the gate insulating layer is formed on the source electrode, the floating electrode, and the drain electrode, and the gate electrode is formed on the gate insulating layer.

6. The display device of claim 4, wherein the carbon nanotube patterns are formed on the source electrode, the floating electrode, and the drain electrode, the gate insulating layer is formed on the carbon nanotube patterns, and the gate electrode is formed on the gate insulating layer.

* * * * *